US007811879B2

(12) United States Patent
Lam et al.

(10) Patent No.: US 7,811,879 B2
(45) Date of Patent: Oct. 12, 2010

(54) PROCESS FOR PCM INTEGRATION WITH POLY-EMITTER BJT AS ACCESS DEVICE

(75) Inventors: Chung Hon Lam, Peekskill, NY (US); Bipin Rajendran, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 322 days.

(21) Appl. No.: 12/121,875

(22) Filed: May 16, 2008

(65) Prior Publication Data
US 2009/0286368 A1  Nov. 19, 2009

(51) Int. Cl.
*H01L 21/8249* (2006.01)
(52) U.S. Cl. ............... 438/234; 438/202; 438/625; 257/5; 257/370; 257/E27.004; 257/E29.17
(58) Field of Classification Search .......... 257/E21.696, 257/E21.632, E29.345, E27.004, E29.17, 257/370, 2–5, E21.001, E45.002, E47.001; 438/234, 200, 202, 597, 625, 629, 95, 587, 438/199
See application file for complete search history.

(56) References Cited

U.S. PATENT DOCUMENTS 3,717,515 A * 2/1973 Ashar et al. ............. 438/349
2002/0177292 A1* 11/2002 Dennison ................. 438/587

* cited by examiner

*Primary Examiner*—Davienne Monbleau
*Assistant Examiner*—Shweta Mulcare
(74) *Attorney, Agent, or Firm*—Ido Tuchman; Vazken Alexanian

(57) ABSTRACT

Techniques for forming a memory cell. An aspect of the invention includes forming FET gate stacks and sacrificial cell gate stacks over the substrate. Spacer layers are then formed around the FET gate stacks and around the sacrificial cell gate stacks. The sacrificial cell gate stacks are then removed such that the spacer layers around the sacrificial cell gate stacks are still intact. BJT cell stacks are then formed in the space between the spacer layers where the sacrificial cell gate stacks were formed and removed, the BJT cell stacks including an emitter layer. A phase change layer above the emitter contacts and an electrode above the phase change layer are then formed.

16 Claims, 20 Drawing Sheets

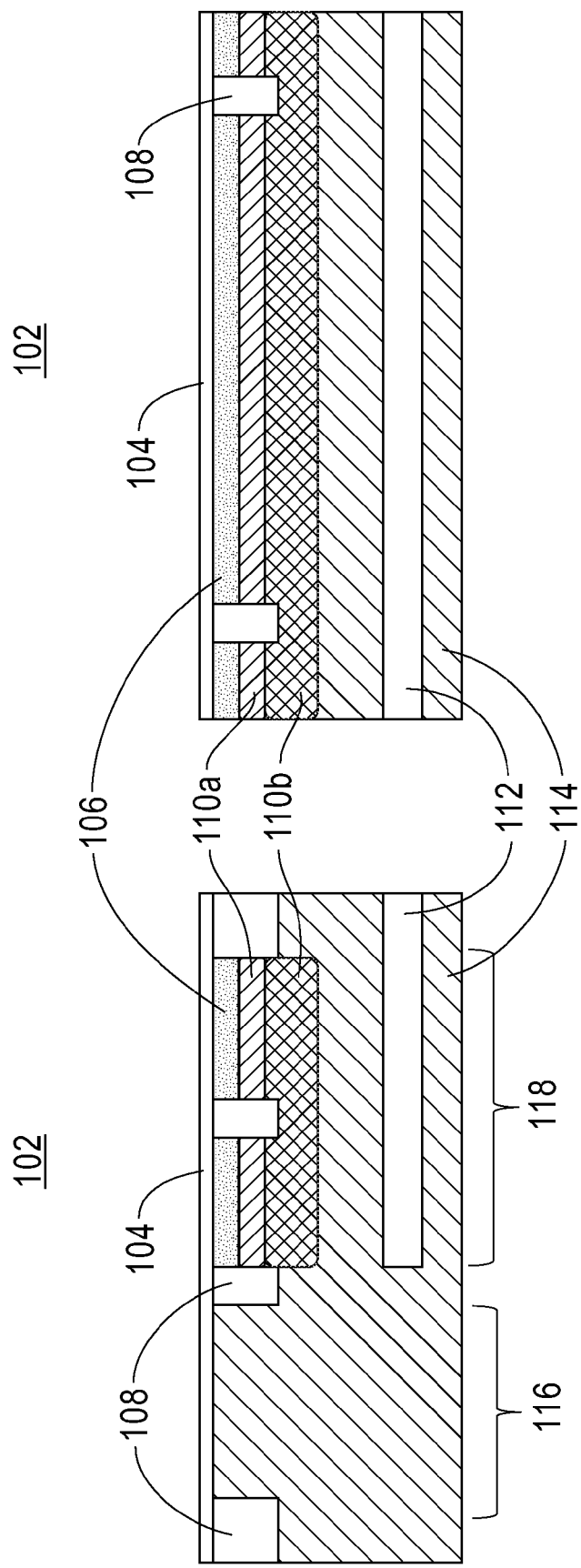

PROCESS FOR PCM INTEGRATION WITH POLY-EMITTER BJT AS ACCESS DEVICE

BACKGROUND OF THE INVENTION

1. Field of the Invention

The present invention relates to formation of a bipolar junction transistor with polycrystalline silicon emitter as an access device for a phase change memory cell.

2. Description of Background

There are two major groups in computer memory: non-volatile memory and volatile memory. Constant (or nearly constant) input of energy in order to retain information is not necessary in non-volatile memory but is required in the volatile memory. Thus, non-volatile memory devices contain memory in which the state of the memory elements can be retained for days to decades without power consumption. Examples of non-volatile memory devices are Read Only Memory (ROM), Flash Electrical Erasable Read Only Memory, Ferroelectric Random Access Memory, Magnetic Random Access Memory (MRAM), and Phase Change Memory (PCM). Examples of volatile memory devices include Dynamic Random Access Memory (DRAM) and Static Random Access Memory (SRAM).

The present invention is directed to resistive non-volatile memories, such as phase change memory. In phase change memory, information is stored in materials that can be manipulated into different phases. Each of these phases exhibit different electrical properties which can be used for storing information. The amorphous and crystalline phases are typically two phases used for bit storage (1's and 0's) since they have detectable differences in electrical resistance. Specifically, the amorphous phase has a higher resistance than the crystalline phase.

Chalcogenides are a group of materials commonly utilized as phase change material. This group of materials typically contain a chalcogen (Periodic Table Group 16/VIA) and a more electropositive element. Selenium (Se) and tellurium (Te) are the two most common semiconductors in the group used to produce a chalcogenide when creating a phase change memory cell. An example of this would be $Ge_2Sb_2Te_5$ (GST), SbTe, and $In_2Se_3$. However, some phase change materials do not utilize chalcogen, such as GeSb. Thus, a variety of materials can be used in a phase change material cell as long as they can retain separate amorphous and crystalline states.

Phase change memory arrays are usually configured in a cross-point architecture with the memory element controlled by an access device such as a CMOS transistor or a diode at every junction. One problem in PCM and CMOS integration is the drive current required to create a phase change in the phase change material. Small MOSFET devices necessary to provide high density of bits per unit area do not provide enough current to switch the resistive state of phase change materials. A closely packed diode array can provide enough drive current for a resistive phase change in a memory cell but a significant amount of current crosses over to adjacent memory cells ("cross-talk") in high-density storage devices. Another possibility is the use of a bipolar junction transistor (BJT). However, the integration of CMOS and BJT arrays has proven difficult. Thus, it is desirable to find a method and structure capable of providing the drive current necessary for resistive phase change in a memory cell, minimizing cross-talk between memory cells, and easily integrated into a memory circuit.

SUMMARY OF THE INVENTION

One exemplary aspect of the present invention is a method for forming a phase change memory cell with a bipolar junction transistor (BJT) access device integrated with CMOS devices. The method includes forming a buried doped region, shallow trench isolation regions, and a first insulating layer on a starting substrate such that the buried doped region is formed within a memory array region of the substrate, the shallow trench isolation regions are formed within the substrate and the top of the shallow trench isolation regions are continuous with the surface of the substrate, and the first insulating layer is disposed on the top surface of the substrate and top surfaces of the shallow trench isolation regions. The method also includes forming a base region, a pedestal collector, and a sub-collector within the substrate below the first insulating layer in the memory array region. The sub-collector is formed above the buried doped region, the pedestal collector is formed above the sub-collector, and the base region is formed above the pedestal collector. The first insulating layer is removed. Another forming operation forms field effect transistor (FET) gate stacks and sacrificial memory cell gate stacks over the substrate. The sacrificial memory cell gate stacks and the FET gate stacks include a gate oxide layer and a semiconductor layer. The sacrificial memory cell gate stacks are disposed above the base region and pedestal sub-collector in the memory array region of the substrate, and the FET gate stacks are disposed above a FET region in the substrate. Furthermore, the FET region is separate from the memory array region.

Spacer layers are formed around the FET gate stacks and around the sacrificial memory cell gate stacks, and above the substrate. Doped regions are formed for source-drain contacts in the FET region, in between the sacrificial memory cell gate stacks and the spacer layers surround the sacrificial memory cell gate stack, and for base and collector contacts in the memory array region. A converting operation converts at least a portion of the doped regions into silicide regions such that source-drain contact silicide regions are formed in the FET region, FET gate stack regions, and base and collector contact regions. A passivation layer is formed above the substrate, the FET gate stacks, the sacrificial memory cell gate stacks, and above and around the spacer layers. A surrounding insulating layer is formed above the passivation layer. Furthermore, metal liner and plugs are formed within trenches. The trenches formed are through the surface of the surrounding insulating layer to the source-drain contact silicide regions in the FET region, and to the base and collector contact silicide regions. The sacrificial memory cell gate stacks are removed such that the spacer layers formed around the sacrificial memory cell gate stacks are still intact.

Bipolar junction transistor (BJT) cell stacks are formed in the space between the spacer layers where the sacrificial cell gate stacks were formed and removed. The BJT cell stacks include an emitter layer. At least a portion of the emitter layer is converted into a silicide compound such that emitter layer contact silicide regions are formed. A phase change layer is formed above the emitter contacts, and an electrode is formed above the phase change layer.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 1A and 1B illustrate a starting wafer with collector implants and base implants.

DETAILED DESCRIPTION OF THE INVENTION

Figure 2A:
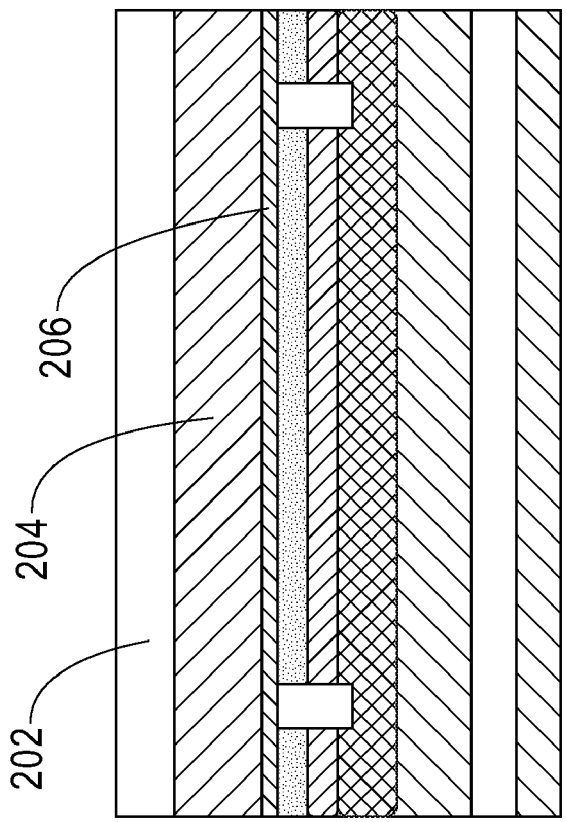
FIGS. 2A, 2B, 3A, and 3B illustrate formation of gate stacks.

The present invention is described with reference to embodiments of the invention. Throughout the description of the invention reference is made to FIGS. 1-20 where the A-type figures illustrate a view parallel to a bit-line in the invention and the B-type figures illustrate a view parallel to a word-line in the invention.

As described in detail below, an aspect of the present invention is a method for forming phase change memory (PCM) cell integrated with a bipolar junction transistor (BJT) access device. The BJT access device provides the drive current to operate the PCM device with minimal crosstalk between adjacent individual phase change memory cells. Furthermore, memory cells of the present invention may be advantageously formed together with CMOS devices, such as MOSFETs, on the same substrate. Thus, embodiments of the present invention can utilize both the low crosstalk advantages of the BJT memory cell design and the CMOS power consumption advantages of peripheral circuitry on the same integrated circuit.

FIGS. 1A and 1B illustrate an exemplary embodiment of a starting wafer 102 comprised of a substrate 114 with a buried doped region 112, a pedestal collector 110a, a sub-collector 110b, a base region 106, a first insulating layer 104, and shallow trench isolation regions 108. As stated above, FIG. 1A illustrates a view parallel to the bit-line of the memory cell 102 and FIG. 1B illustrates a view parallel to the word-line of the memory cell 102. The buried doped region 112 is N-doped, and the pedestal collector 110a and the sub-collector 110b are P-doped in this particular embodiment of the invention, where the BJT access device formed is a PNP transistor. In an alternate embodiment of the invention, the doping types of these regions are reversed to form a NPN transistor.

In one particular embodiment of the invention, the substrate 114 is a p-type starting silicon wafer. In an alternate embodiment of the invention, the substrate 114 is an n-type starting silicon wafer. Those skilled in the art will recognize that a normal shallow trench isolation (STI) process can be utilized to form the shallow trench isolation regions 108. As illustrated, the shallow trench isolation regions 108 are formed such that the top surfaces of the shallow trench isolation regions 108 are parallel to the top surface of the substrate 114.

The first insulating region layer 104 can then be formed above the substrate 114 with a variety of processes known in the art, such as, but not limited to, plasma-enhanced chemical vapor deposition (PECVD), chemical vapor deposition (CVD), low-pressure chemical vapor deposition (LPCVD), and a variety of other deposition processes for insulating materials. The first insulating layer 104 is comprised of an insulating (dielectric) material that can be, but not limited to, $SiO_2$.

A photolithographic mask is then formed on the existing structures and the substrate 114 is implanted with dopant atoms to form the buried doped region 112. The photolithographic mask protects a FET region 116 and exposes a memory array region 118 such that the doping processes only affect the exposed memory array region 118. In a PNP BJT access device, the pedestal collector 110a and sub-collector 110b are doped with p-type dopants such as Boron or BF2. As illustrated, the pedestal collector 110a and the sub-collector 110b are formed above the buried doped region 112. Those skilled in the art will recognize that high-energy ion implantation processes can be utilized for forming the pedestal collector 110a and sub-collector 110b. In one particular embodiment of the invention, the BJT access device is configured as a PNP transistor. The pedestal collector 110a and sub-collector 110b are p-doped, and the base region 106 is n-doped. In another embodiment of the invention, the BJT access device is configured as a NPN transistor, the pedestal collector 110a and sub-collector 110b are n-doped and the base region 106 is p-doped. The base region 106 can incorporate Germanium as well. After the buried doped region 112, the pedestal collector 110a, and the sub-collector 110b are formed, the photolithographic mask is removed with a photoresist strip process well known to those skilled in the art.

Figure 2B:
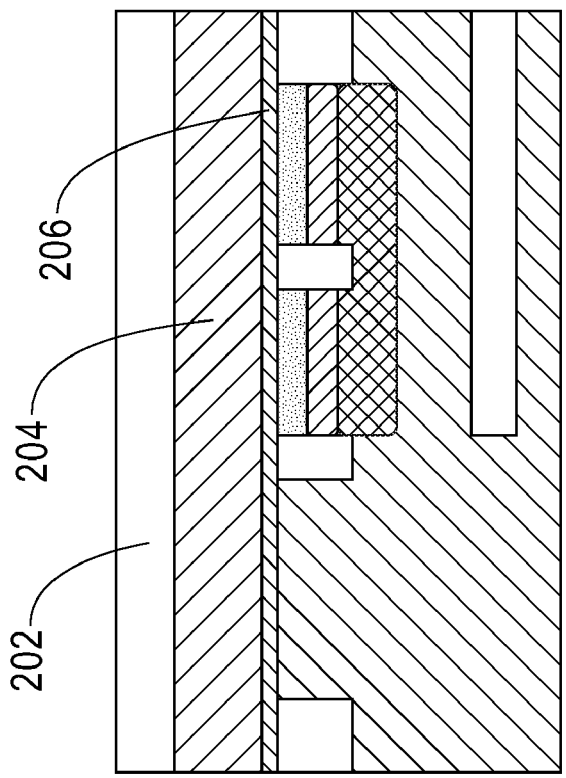

Now turning to FIGS. 2A and 2B, the first insulating layer 104 is removed and a gate oxide layer 206 is formed above the existing structures. Those skilled in the art will again recognize that a variety of processes can be used to form the gate oxide layer 206, such as thermal oxidation. A semiconductor layer 204 is then formed above the gate oxide layer 206. Those skilled in the art will recognize that a variety of processes such as, but not limited to, Low Pressure Chemical Vapor Deposition (LPCVD) and Plasma Enhanced Chemical Vapor Deposition (PECVD) may be used to create the semiconductor layer 204. In one particular embodiment of the invention, the semiconductor layer 204 is comprised of polycrystalline silicon. A second insulating layer 202 is then formed above the semiconductor layer 204. The second insulating layer 202 can be formed using a variety of processes known to those skilled in the art. In one particular embodiment of the invention, the second insulating layer 202 is comprised of tetraethyl orthosilicate (TEOS).

Figure 3A:
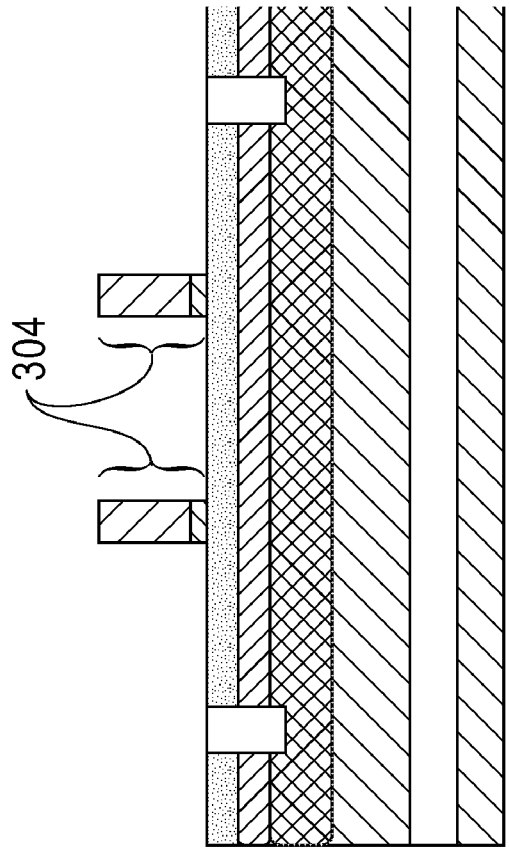
Figure 3B:
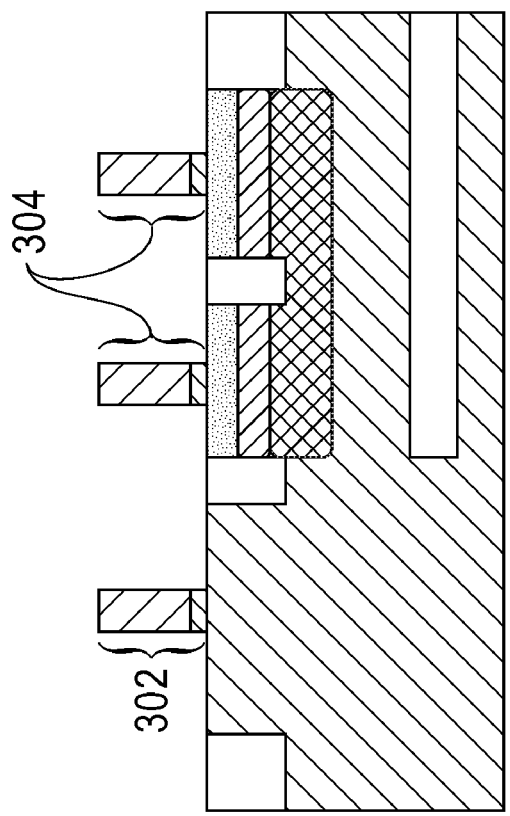
Figures 4A, 4B:
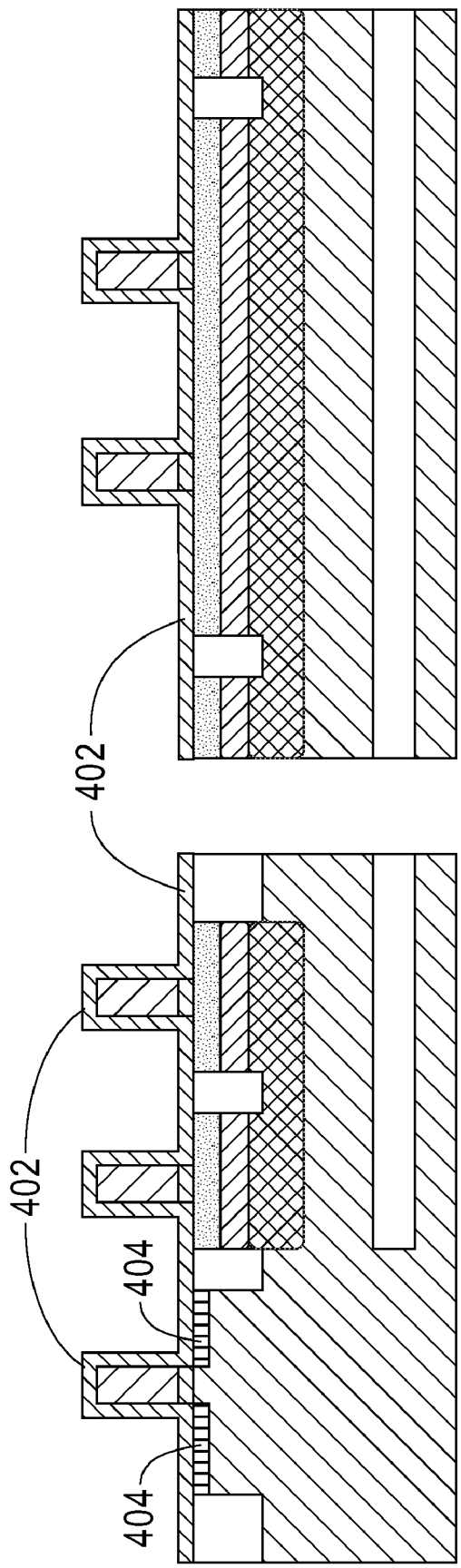
FIGS. 4A, 4B, 5A, 5B, 6A, and 6B illustrate formation of spacer layers and source-drain implants.

FIGS. 3A and 3B illustrate the formation of field effect transistor (FET) gate stacks 302 and sacrificial memory cell gate stacks 304. In one particular embodiment of the invention, a photolithographic mask is first applied above the second insulating layer. The photolithographic mask is configured to protect pocket regions in the memory array region and pocket regions in the FET region. The exposed regions below the photolithographic mask are etched stopping at the base region and substrate. In one particular embodiment of the invention, the etch is a dry etching process such as, but not limited to, reactive-ion etching (RIE). The photolithographic mask is then removed with a photoresist strip process. The second insulating layer is then etched with a wet etch such as, but not limited to, utilizing hydrofluoric acid (HF). The remaining structures above the substrate and base region are the FET gate stacks 302 comprising of the gate oxide layer and semiconductor layer, and the sacrificial memory cell gate stacks 304 also comprises the gate oxide layer and semiconductor layer.

In FIG. 4, a first oxide layer 402 is formed above the semiconductor layer, substrate, and base region. Those skilled in the art will recognize the processes utilized to form the first oxide layer 402. In one particular embodiment of the invention, the first oxide layer 402 is thermal oxide. Halo implants 404 are then formed in the substrate below the first oxide layer 402 in the FET region. In one particular embodiment of the invention, a photolithographic mask protects the memory array region. Again, those skilled in the art will recognize a variety of processes available to form halo implants 404 in the FET region. Additionally, a rapid thermal anneal (RTA) may be used to activate the implants.

Figure 5B:
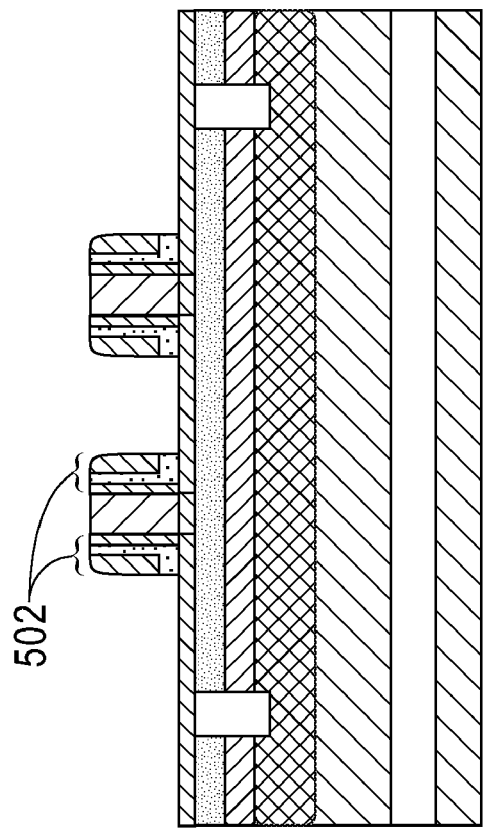
Figure 5A:
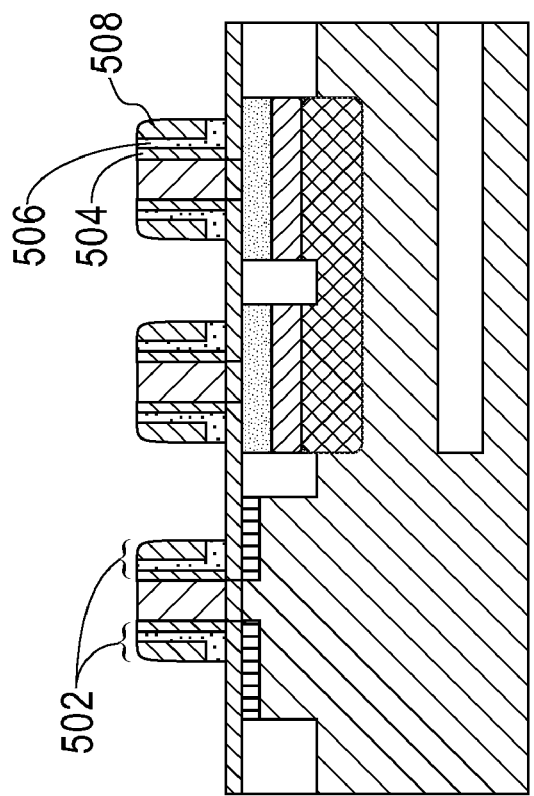

Now turning to FIGS. 5A and 5B, spacer layers 502 are formed around the FET gate stacks and around the sacrificial cell gate stacks. In one particular embodiment of the invention, the spacer layers 502 are comprised of a first oxide spacer 504, a nitride spacer 506, and a second oxide spacer 508. The first oxide spacer 504 is comprised of the first oxide layer formed in FIGS. 4A and 4B. In one embodiment of the invention, a nitride spacer layer is formed above the first oxide layer then a second oxide layer is formed above the nitride spacer layer. Standard spacer processes, known to those skilled in the art, can be performed to form the spacer layers 502. An example of a spacer process is forming a photolithographic mask above the second oxide layer and etching such that the etch stops on the semiconductor layer in the FET gate stacks and the semiconductor layer in the sacrificial cell gate stacks; then the photolithographic mask is stripped. In one particular embodiment of the invention, the etch process proceeds through the second oxide layer, the nitride layer, and first oxide layer. In an alternate embodiment of the invention, the etch process proceeds through the second oxide layer and the nitride layer while stopping on the first oxide layer.

Figure 6A:
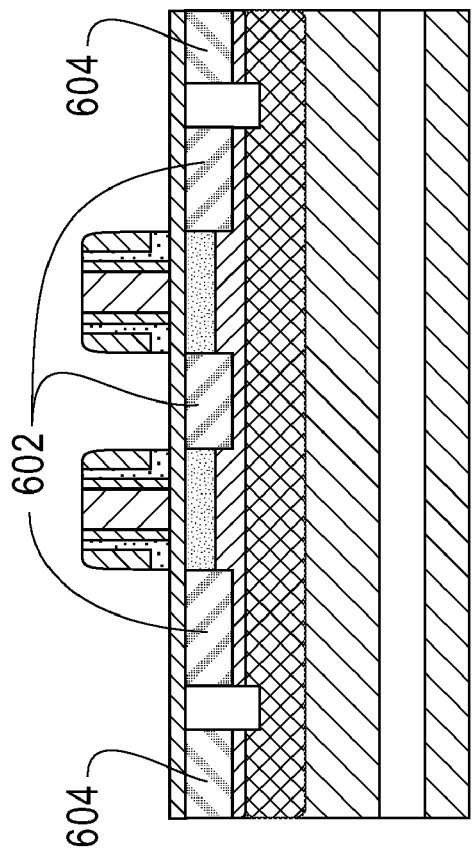
Figure 6B:
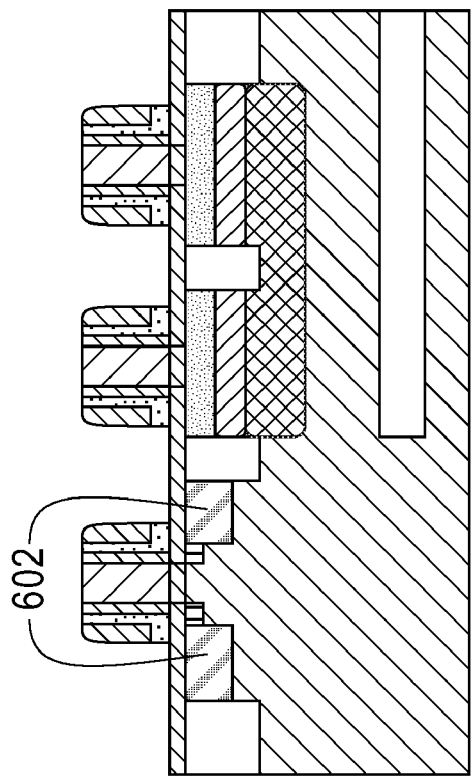

At FIG. 6A, source-drain contact regions 602 are formed in the FET region. In FIG. 6B, the regions between the sacrificial memory cell gate stacks 603 are also modified to reduce the resistivity of the word-line. Furthermore, base and collector contact regions 604 are formed. Those skilled in the art will recognize a variety of processes can be utilized in forming source-drain contact regions 602 for the FET region (FIG. 6A) and forming the modified regions between the sacrificial memory cell gate stacks 603 and the base and collector contact regions 604 in the cell region (FIG. 6B). In one embodiment of the invention, the source-drain contact regions 602, modified regions between the sacrificial memory cell gate stacks 603 and base and collector contact regions 604 are formed by forming photolithographic masks and ion implanting in the exposed regions. In one particular embodiment of the invention, a RTA is performed to activate the implants (dopant activation).

Figure 7A:
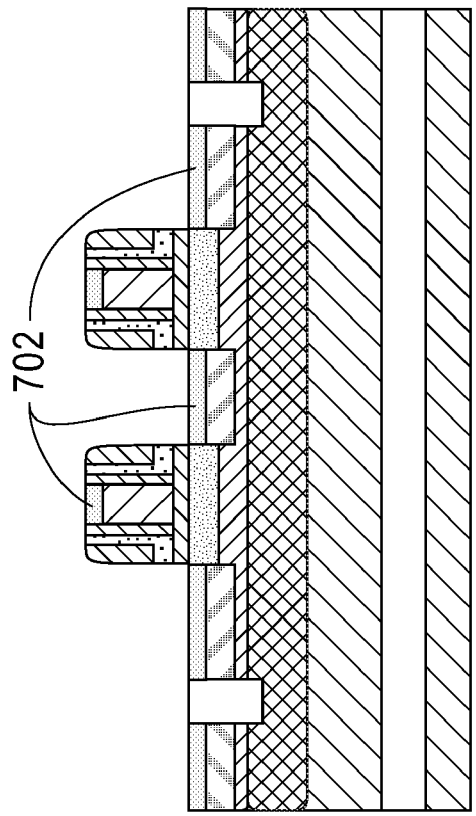
FIGS. 7A and 7B illustrate silicidation.
Figure 7B:
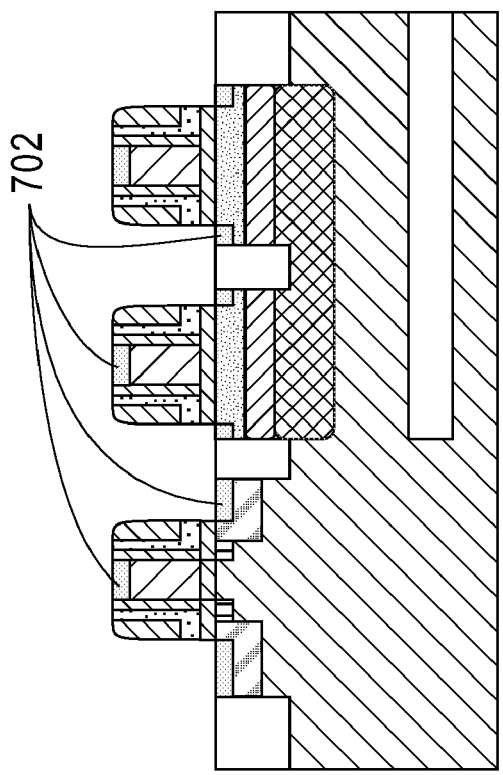

In FIGS. 7A and 7B, in an exemplary embodiment of the invention, silicide compounds 702 are formed on the source-drain contact regions and semiconductor layers in the FET gate stacks in the FET region by converting the surfaces to the silicide compounds. In one particular embodiment of the invention the first oxide layer is stripped before the formation of the silicide compounds 702. The silicide compounds 702 are also formed on the semiconductor layers in the sacrificial memory cell gate stacks and on the modified regions between the sacrificial memory cell gate stacks. In an alternate embodiment of the invention, the silicide compounds 702 are formed over every contact region and over every exposed silicon layer. The areas where the silicide compounds 702 are formed depend on the resistivity desired for the memory array region and FET region. In an alternate embodiment of the invention, an insulating layer is deposited over the wafer, patterned using photolithography and then etched, before the silicide compounds 702 are made, allowing formation of such contacts only on select locations. For instance, such a process might be used if it is preferred to have no silicide compounds 702 on the semiconductor layers in the sacrificial memory cell gate stacks and on the modified regions between the sacrificial memory cell gate stacks.

In one particular embodiment of the invention, the silicide compounds 702 are formed by silicidation of the aforementioned structures. Those skilled in the art will recognize processes necessary for silicidation such as, but not limited to, depositing a metal such as, but not limited to, cobalt (Co), tungsten (W), or nickel (Ni) on the surface of the silicon structures (the source-drain contact regions, the semiconductor layers in the FET gate stacks and sacrificial memory cell gate stacks, and the base and collector contact regions) and performing a RTA. In one particular embodiment of the invention, the surfaces are pre-cleaned prior to the metal deposition and a cleaning wet etch is performed to remove excess metal.

Figures 8A, 8B:
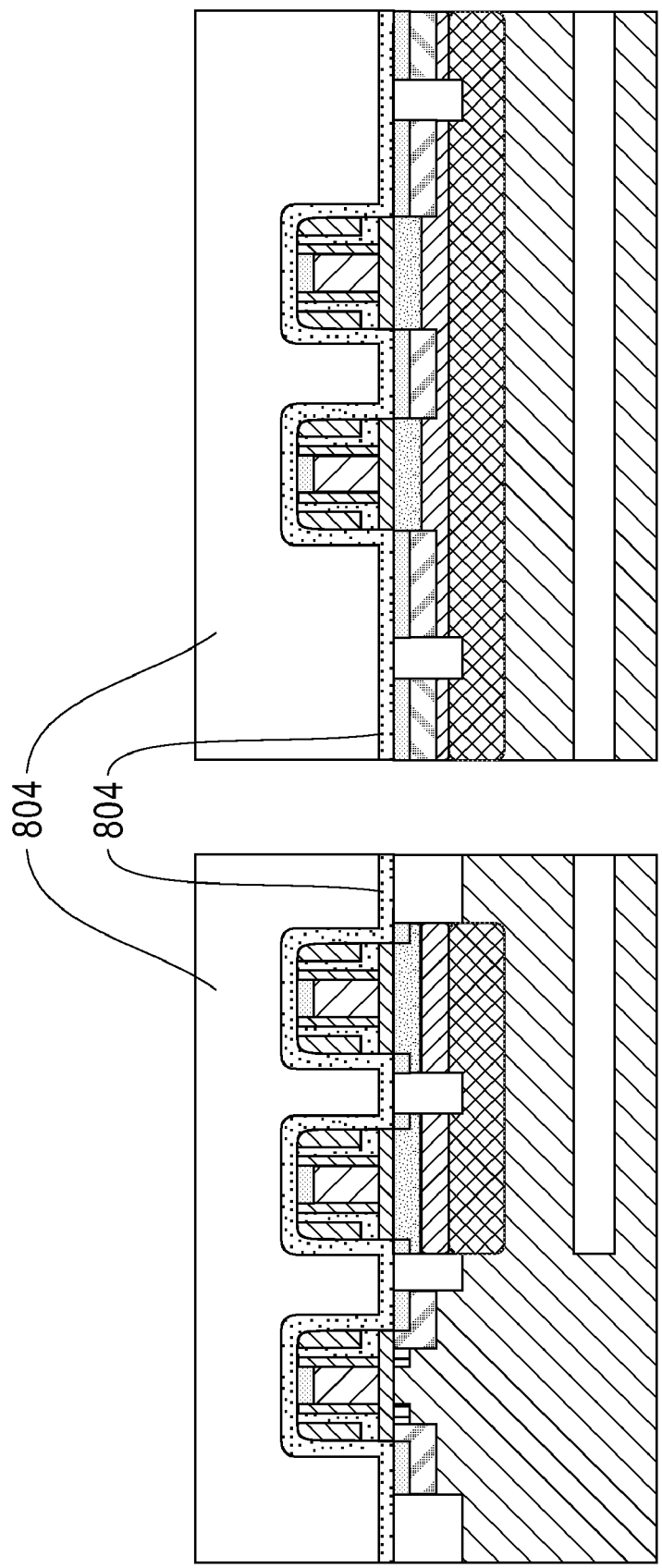
FIGS. 8A, 8B, 9A, 9B, 10A, and 10B illustrate metal liner and plug formation.

Turning to FIGS. 8A and 8B, a passivation layer 804 and a surrounding insulating layer 802 are formed. In an exemplary embodiment of the invention, the passivation layer 804 is comprised of, but not limited to, silicon nitride and the surrounding insulating layer 802 is comprised of, but not limited to, low-temperature oxide (LTO). The formation of the passivation layer 804 and surround insulating layer 802 are done with standard deposition processes known to those skilled in the art.

Figure 9A:
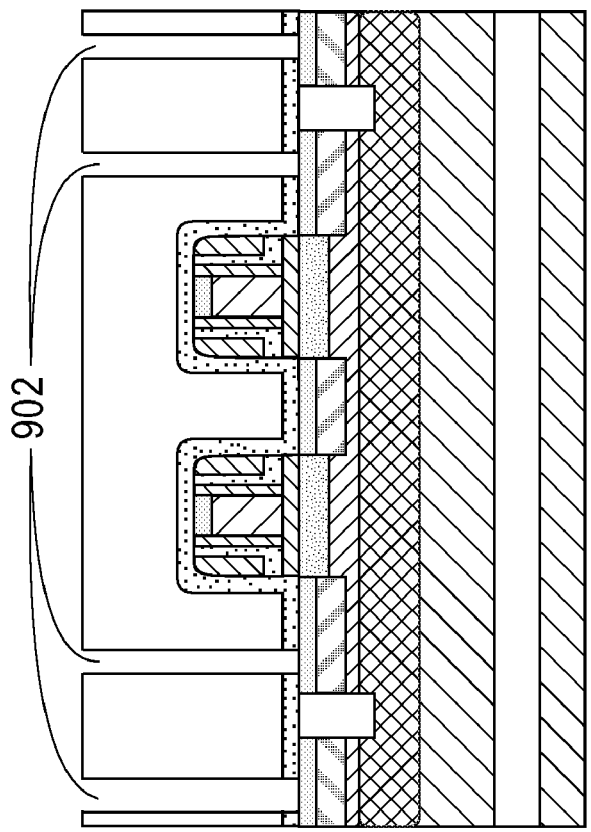
Figure 9B:
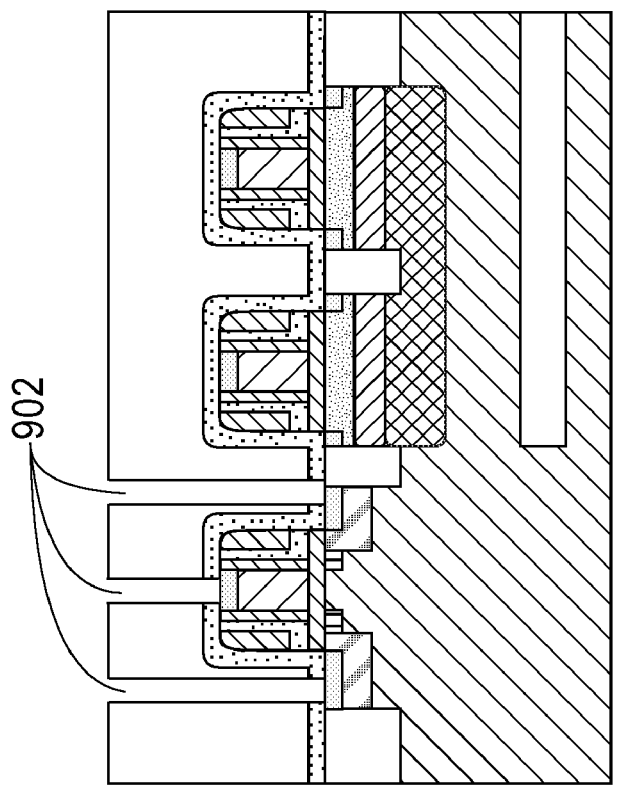

In FIGS. 9A and 9B, trenches 902 are formed above the collector contact regions, source-drain contact regions in the FET region, and the semiconductor layer in the FET gate stacks. As illustrated, the trenches 902 are etched through the surrounding insulating layer, through the passivation layer, stopping on the silicide compounds. Note, that the trenches 902 are not formed above the sacrificial memory cell gate stacks. Those skilled in the art will recognize that a lithographic mask can be formed over the surface of the surrounding insulating layer and a RIE or wet chemical etching can be performed to etch through the aforementioned layers.

In an exemplary embodiment of the invention, the trenches 902 are formed for all areas requiring contacts to the bit-line and the word-line of the memory circuit.

Figure 10A:
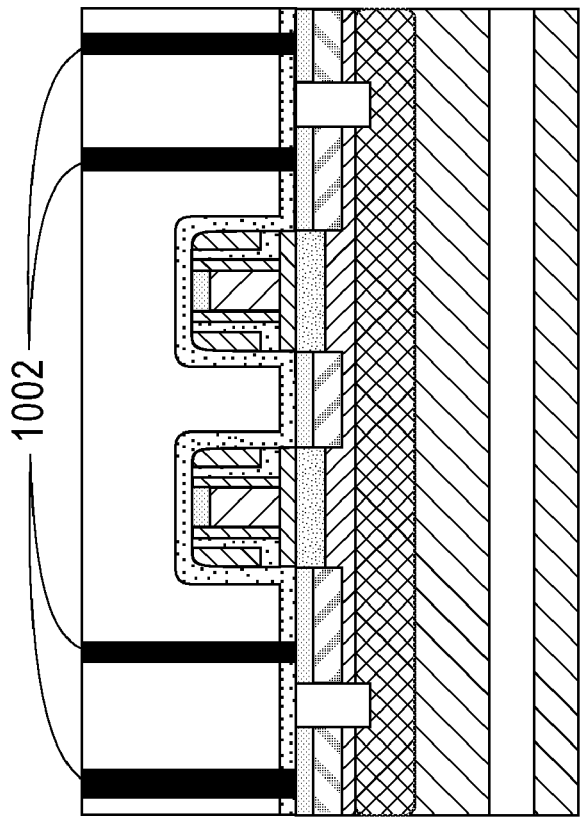
Figure 10B:
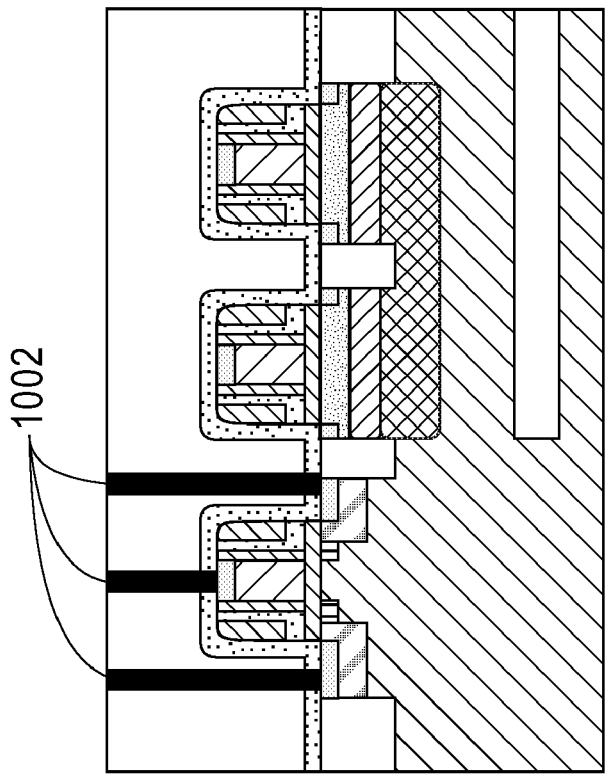

Turning to FIGS. 10A and 10B, metal liners and plugs 1002 are formed in the trenches. Standard metal deposition processes, known to those skilled in the art, are performed to form the metal liners and plugs 1002 in the trenches. In an exemplary embodiment of the invention, the metal liner and plugs 1002 are comprised of a titanium/titanium nitride liner (Ti/TiN) and a tungsten (W) plug. Additionally, a chemical-mechanical polish (CMP) may be performed after the formation of the liners and plugs 1002 so that the surfaces of the liners and plugs 1002 are parallel or continuous with the surface of the surrounding insulating layer.

Figure 11A:
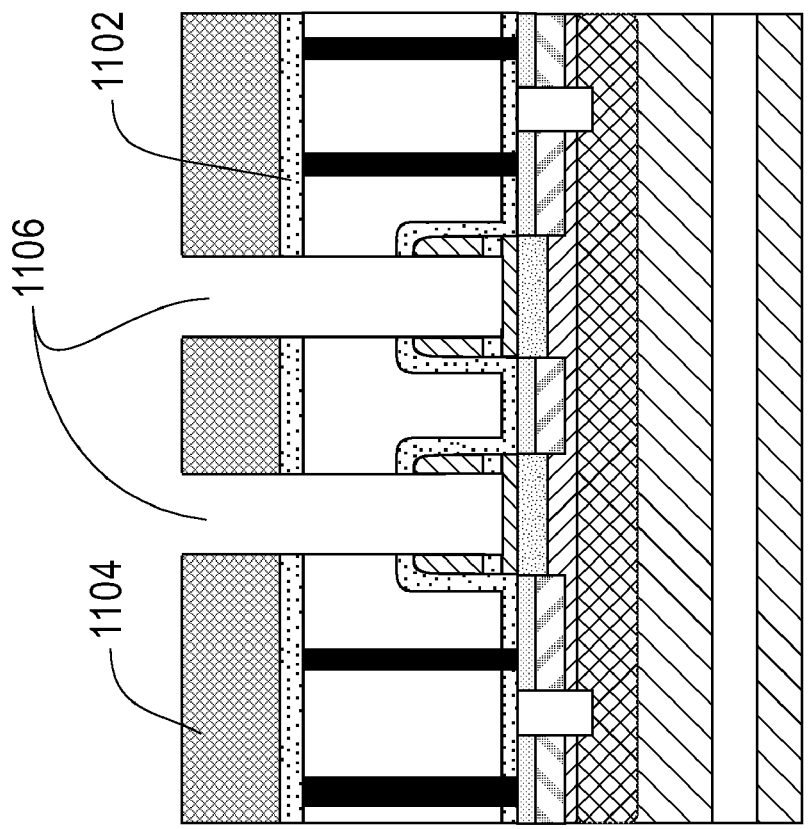
FIGS. 11A, 11B, 12A, 12B, 13A, 13B, 14A, and 14B illustrate formation of emitter layer and BJT access device finalization.
Figure 11B:
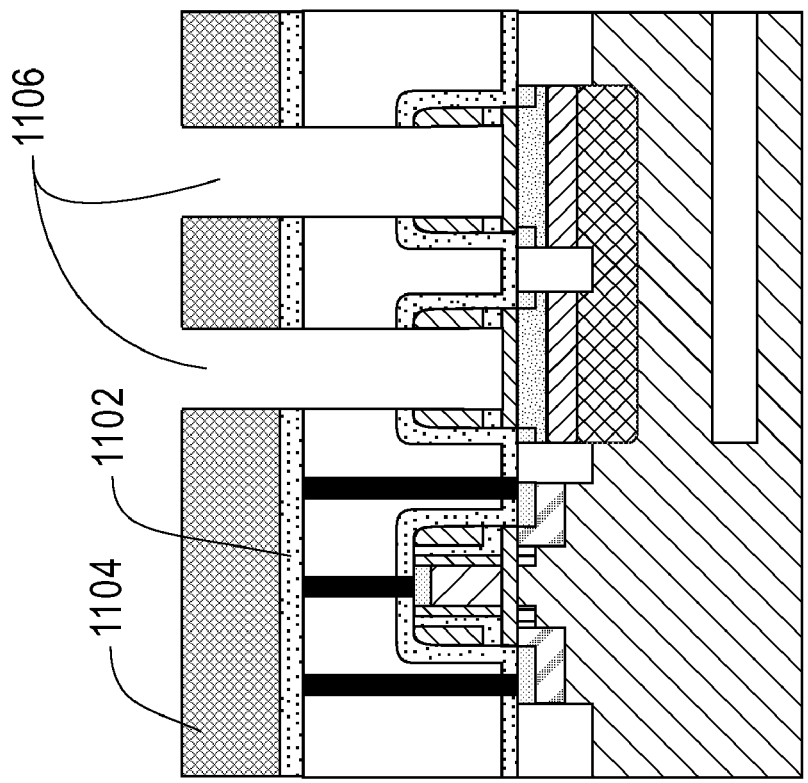

In FIGS. 11A and 11B, a top nitride layer 1102 is formed above the surrounding insulating layer, and a sacrificial emitter layer 1104 is formed above the top nitride layer 1102. In one particular embodiment of the invention, the sacrificial emitter layer 1104 is comprised of polycrystalline silicon. The top nitride layer 1102 and the sacrificial emitter layer 1104 are formed with standard deposition processes known to those skilled in the art.

Also shown in FIGS. 11A and 11B, the semiconductor layer in the sacrificial gate stacks are removed and memory cell trenches 1106 are formed. In an exemplary embodiment of the invention, the memory cell trenches 1106 are formed by applying a lithographic mask and etching through the sacrificial emitter layer 1104, the top nitride layer 1102, the surrounding insulating layer, the passivation layer, the silicide compounds on the sacrificial memory cell gate stacks, the semiconductor layer in the sacrificial memory cell gate stacks, and stopping at the gate oxide layer. Again, those skilled in the art will recognize that a directional dry etch such as RIE or a wet poly/silicide/gate stop etch can be employed for creating the memory cell trenches 1106. The lithographic mask is then removed.

Figure 12A:
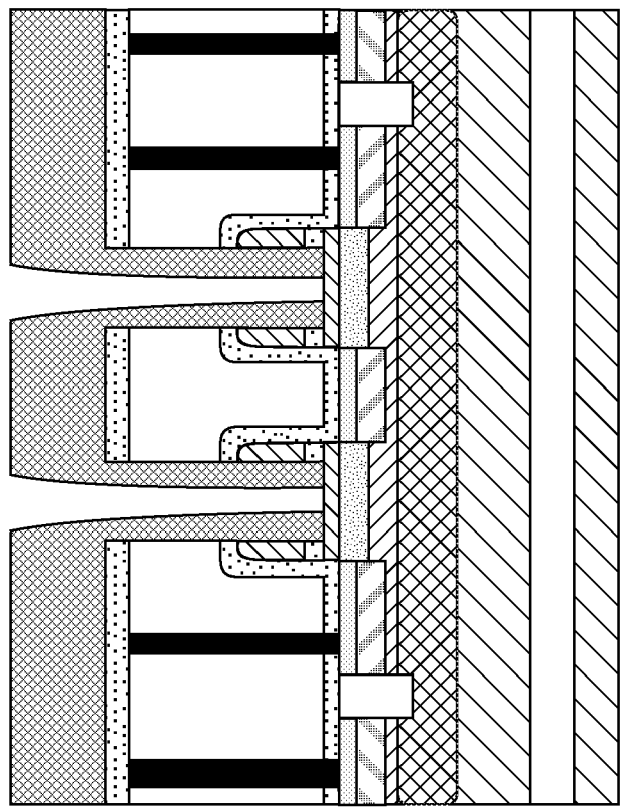
Figure 12B:
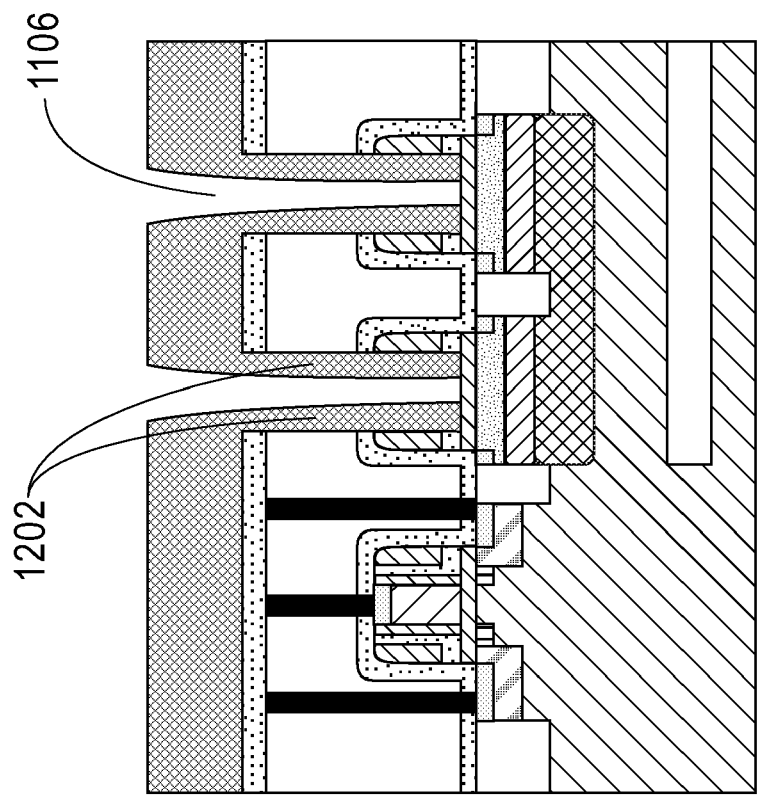

Turning to FIGS. 12A and 12B, a sacrificial emitter spacer 1202 is formed. The sacrificial emitter spacer 1202 is formed along the entire sidewall of the memory cell trenches 1106. In an exemplary embodiment of the present invention, the sacrificial emitter spacer 1202 is comprised of polycrystalline silicon. The sacrificial emitter spacer 1202 is formed in order to protect the surrounding insulating layer. Those skilled in the art will recognize that standard spacer forming processes can be utilized for forming the sacrificial emitter spacer 1202.

Figure 13A:
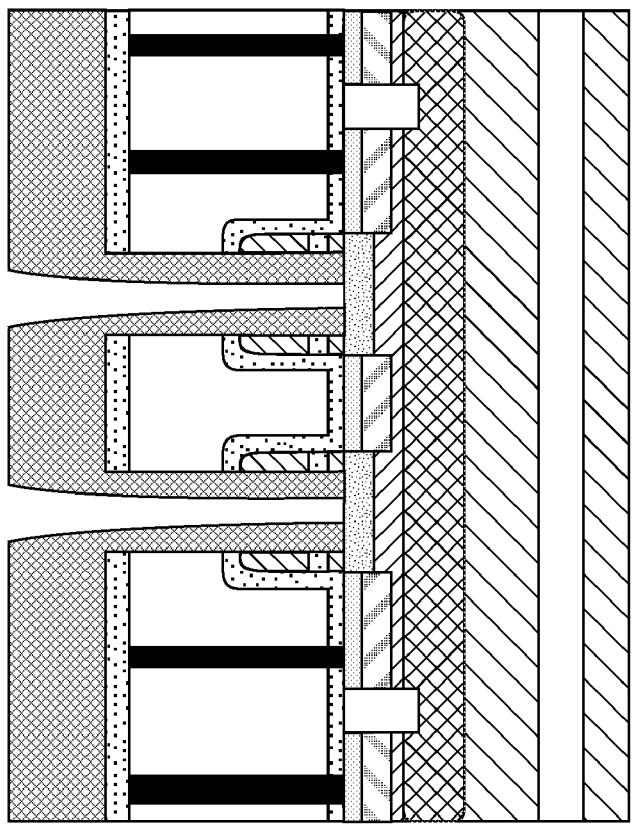
Figure 13B:
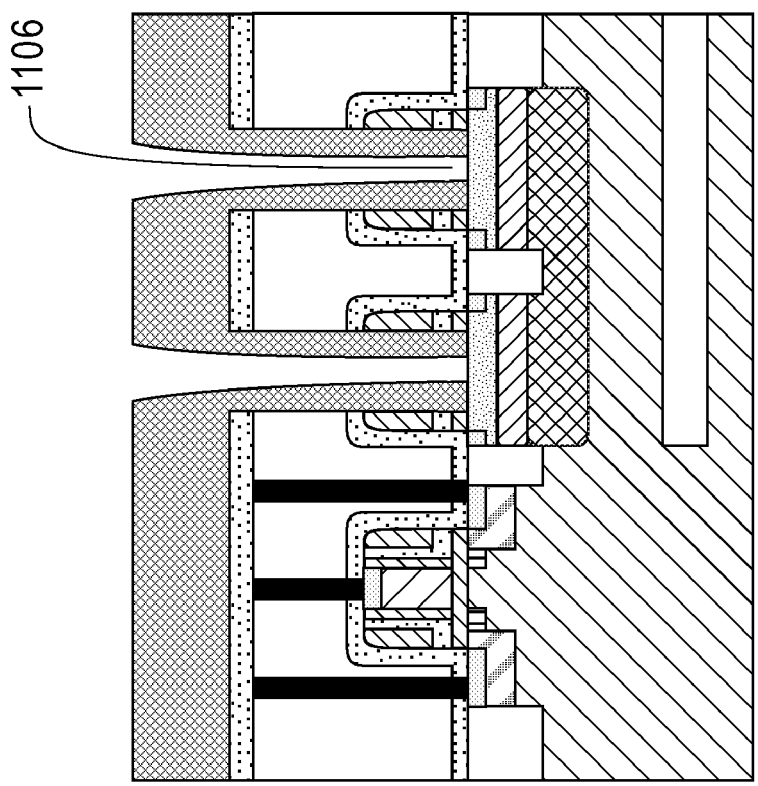

In FIGS. 13A and 13B, the cell trenches 1106 are extended down to the surface of the base region of the memory array region. In one particular embodiment of the invention, the gate oxide layer is etched using a wet hydrofluoric (HF) etch. The sacrificial emitter spacers prevent sidewall recess in the surrounding insulating layer with such an etch.

Figure 14A:
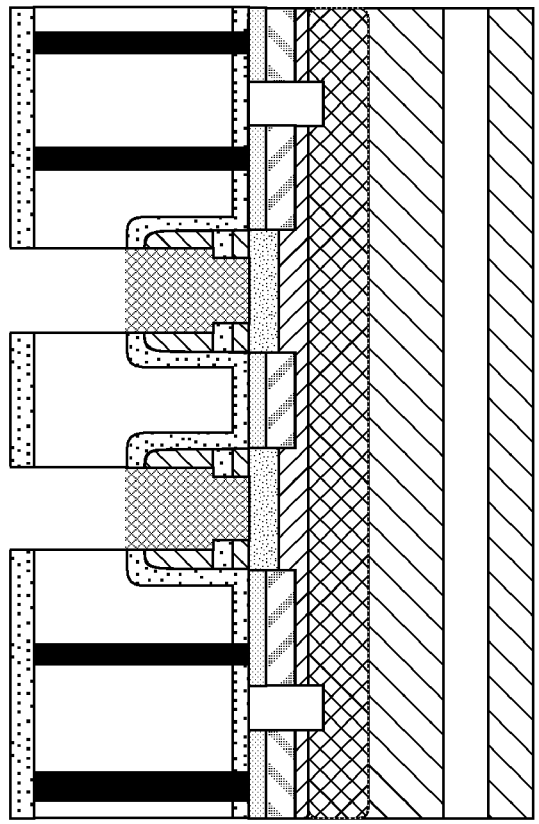
Figure 14B:
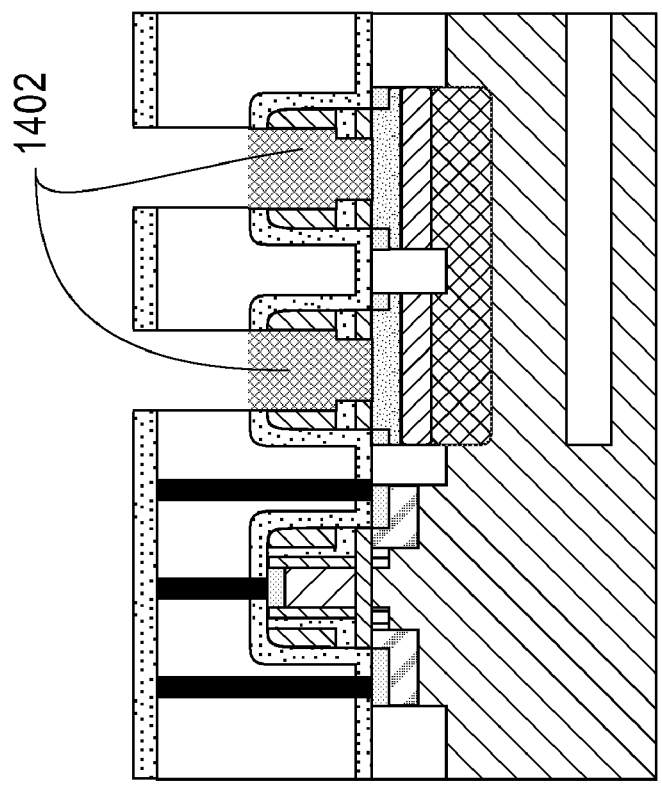

Turning to FIGS. 14A and 14B, the sacrificial emitter layer and the sacrificial emitter spacer are removed with an etch and an emitter layer 1402 is formed in between the spacer layers and above the base region in the memory array region. Those skilled in the art will recognize that a variety of etches may be performed to etch the sacrificial emitter spacer and the sacrificial emitter layer, and a variety of deposition process may be utilized to form the emitter layer 1402.

The emitter layer 1402 may be comprised of a variety of semiconductor materials with positive charge ("holes") for a PNP BJT access device and a variety of semiconductor materials with negative charge ("electrons") for an NPN BJT access device. In an exemplary embodiment of the invention where the BJT access device is set in a PNP configuration, the emitter layer 1402 is comprised of P-doped polycrystalline silicon or P+ polycrystalline silicon. This layer could be formed by, for example, low pressure chemical vapor deposition (LPCVD), rapid thermal chemical vapor deposition (RTCVD), or atomic layer chemical vapor deposition (ALCVD). This region could be doped by, for example, ion implantation or by diffusion during the deposition process. In one embodiment of the invention, a very thin insulator layer comprising of silicon dioxide may be present between the interface of the base region and emitter layer 1402. The purpose of this very thin insulator layer (not shown), if used, is to ensure that the emitter layer 1402 will not turn into single-crystalline form, but will remain in polycrystalline form, during the subsequent fabrication steps. A BJT access device having a polycrystalline emitter has smaller base current than a BJT having a single-crystalline emitter. Thus, a small base current reduces cross-talk among memory cells.

Figure 15B:
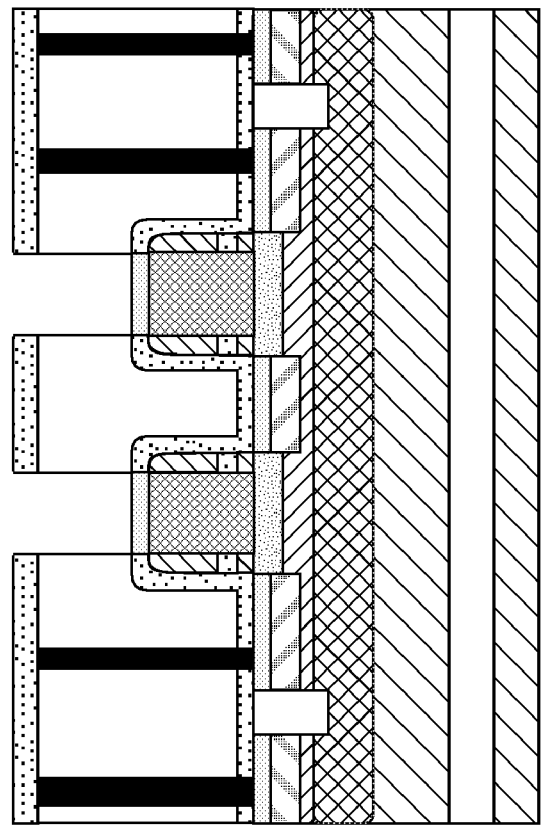
FIGS. 15A and 15B illustrate silicidation.
Figure 15A:
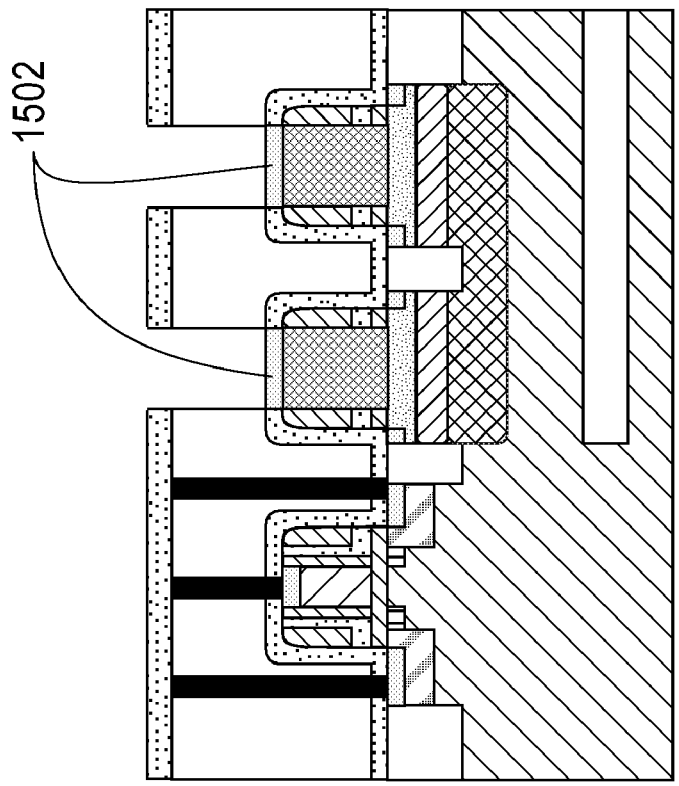

Referring to FIGS. 15A and 15B, emitter layer contact regions 1502 are formed. In an exemplary embodiment of the invention, the emitter layer contact regions 1502 are formed by silicidation. As discussed above, the silicidation is a process well known to those skilled in the art. Again, a rapid thermal anneal (RTA) is performed to form the bonds between the silicon and metal, and a wet metal etch is performed to remove any un-reacted metal.

In the following figures (FIGS. 16-20), formation of a phase change element and metallization are only shown for illustrative purposes. A variety of alternate geometries and methods can be utilized in forming the phase change memory cell.

Figure 16B:
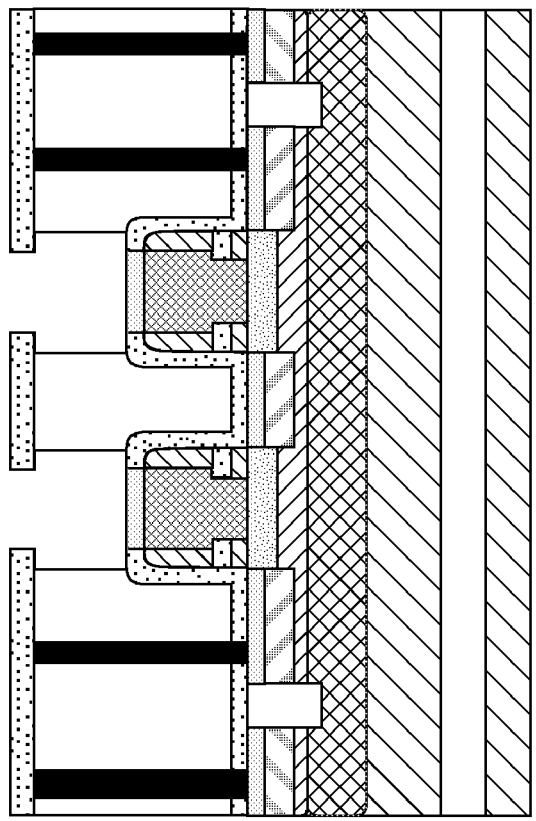
FIGS. 16A, 16B, 17A, 17B, 18A, 18B, 19A, 19B, 20A, and 20B illustrate phase change element formation and metallization.
Figure 16A:
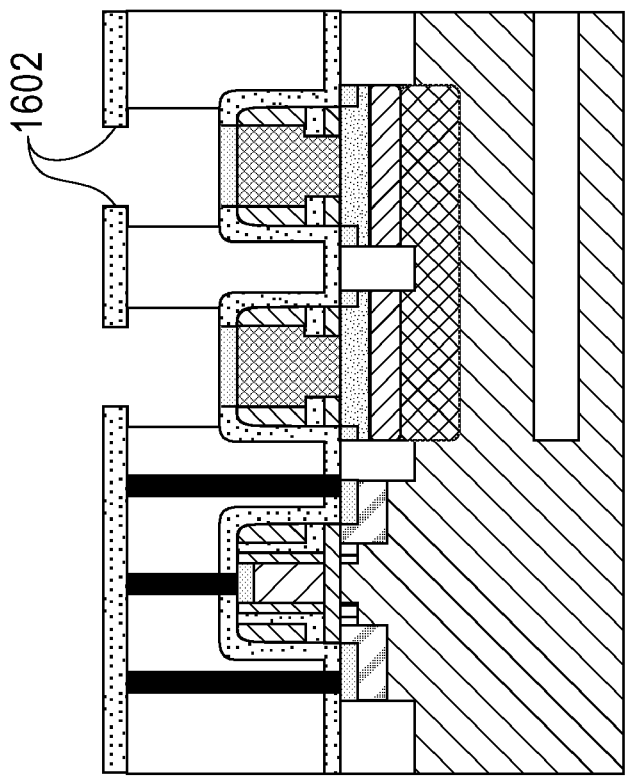

In FIGS. 16A and 16B, an undercut 1602 is formed in the surrounding insulating layer and the top nitride layer. In an exemplary embodiment of the invention, the undercut 1602 is formed by performing a wet dilute hydrofluoric acid (DHF) etch. The DHF etches the surrounding insulating layer at a higher rate than the top nitride layer producing the undercut 1602.

Figure 17A:
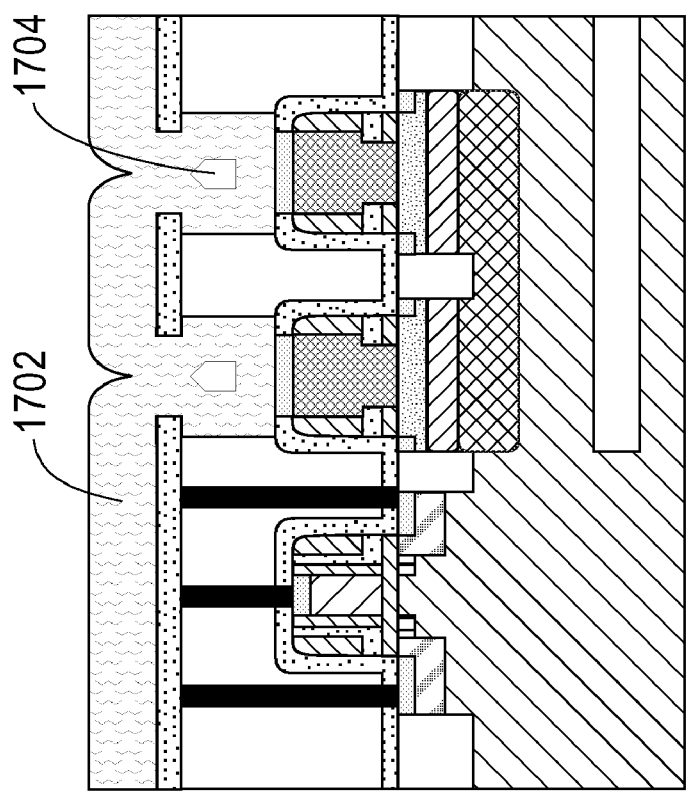
Figure 17B:
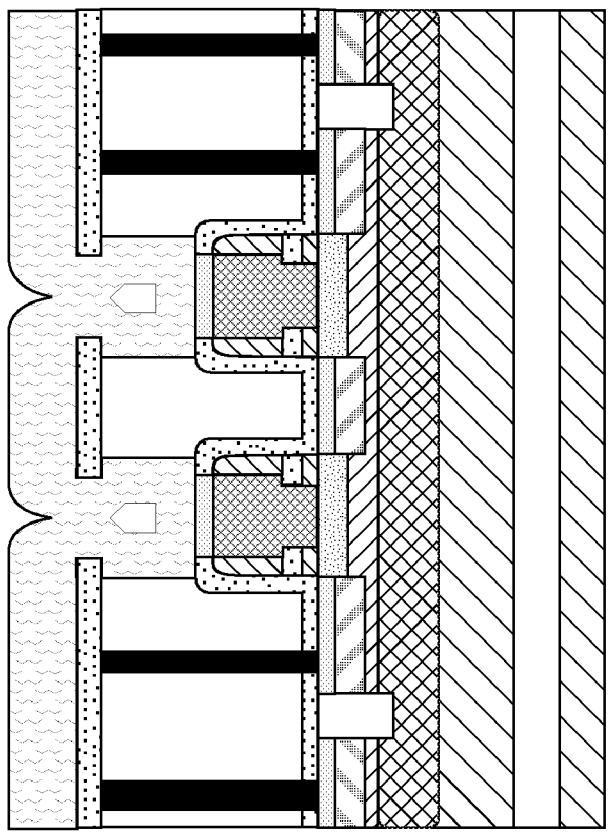

FIGS. 17A and 17B illustrate a deposition of a conformal insulating layer 1702 and a cavity 1704 within the conformal insulating layer 1702 formed in the cell trenches. The undercut formed in FIGS. 16A and 16B causes the conformal insulating layer 1702 to fill the cell trenches in an uneven manner. The diameter of the cavity 1704 in the conformal insulating layer 1702 is approximately twice the size of the undercut. In one particular embodiment of the present invention, the conformal insulating layer 1702 is comprised of conformal silicon dioxide or conformal silicon nitride.

Figure 18A:
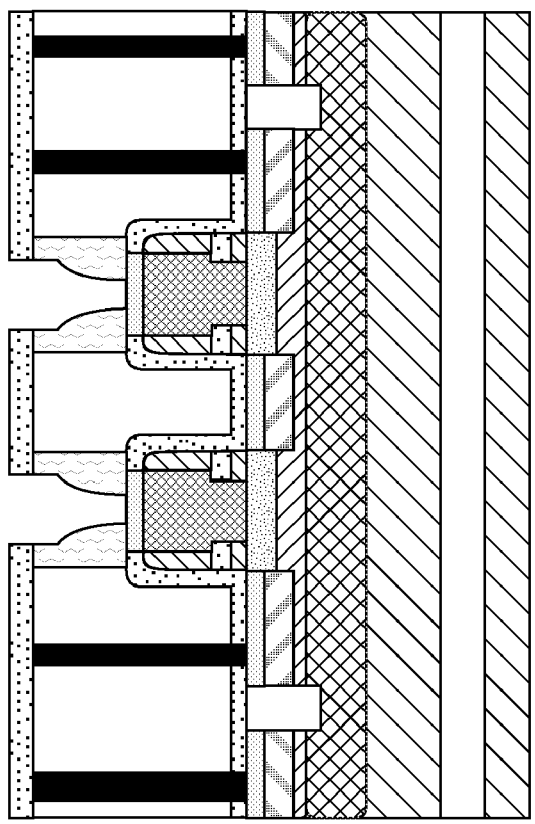
Figure 18B:
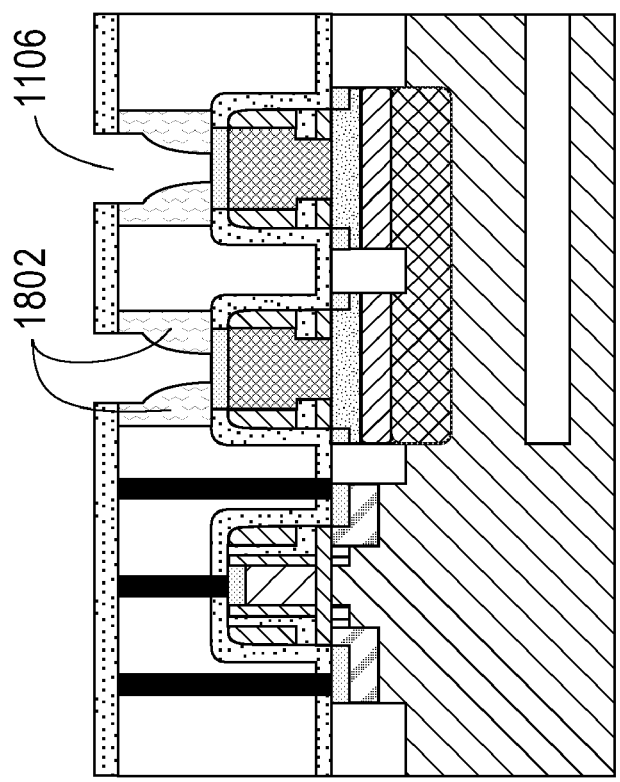

FIGS. 18A and 18B show an etch performed to create conformal insulating spacers 1802 in the cell trenches 1106. Those skilled in the art will recognize that a RIE processes may be utilize to etch the conformal insulating layer to form the conformal insulating spacers 1802.

Figure 19A:
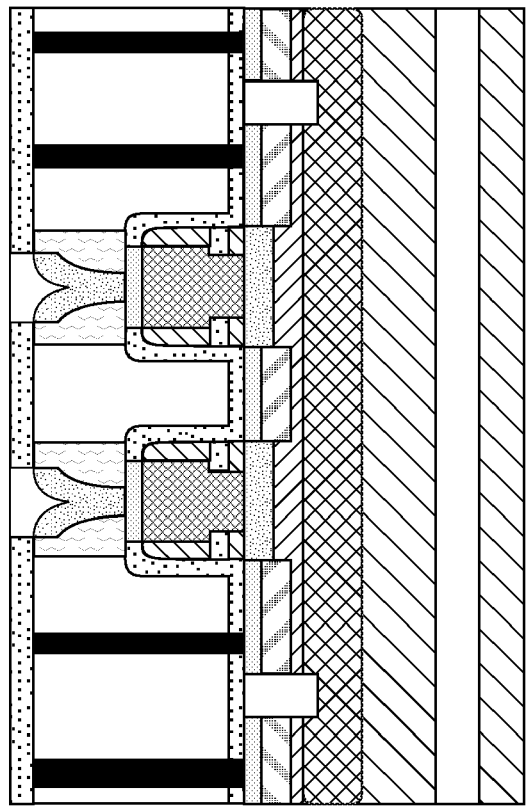
Figure 19B:
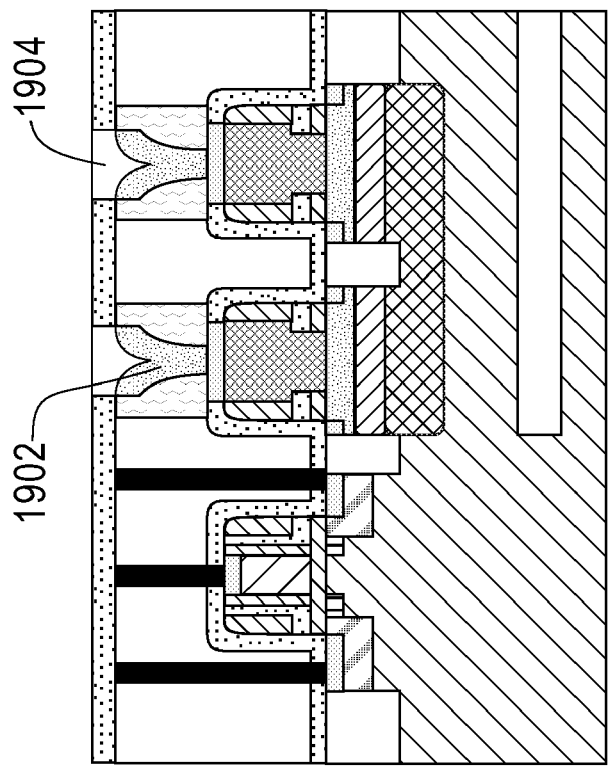

Now turning to FIGS. 19A and 19B, a phase change layer 1902 is formed in the cell trenches and a top electrode 1904 is formed above the phase change layer 1902. Those skilled in the art will recognize that the phase change layer 1902 may be deposited into the trenches and above the top nitride layer with a variety of processes such as, but not limited to, CVD and physical vapor deposition (PVD). The top electrode 1904 may be formed by a variety of metal deposition techniques such as, but not limited to, metal sputter deposition. In an exemplary embodiment of the invention, the phase change layer 1902 is comprised of an alloy of Germanium, Antimony and Tellurium (GST with composition $Ge_2Sb_2Te_5$) and the top electrode 1904 is comprised of titanium nitride (TiN). Note that a variety of phase change materials may be used for the phase change layer 1902 and the top electrode 1904. The only limiting factor for the material used for the phase change layer 1902 is that the material must be able to maintain at least a crystalline phase and an amorphous phase. Those skilled in the art will recognize a variety of chalcogenides may be utilized. Those skilled in the art will recognize that a variety of conductive materials may be used for the top electrode 1904.

Figures 20A, 20B:
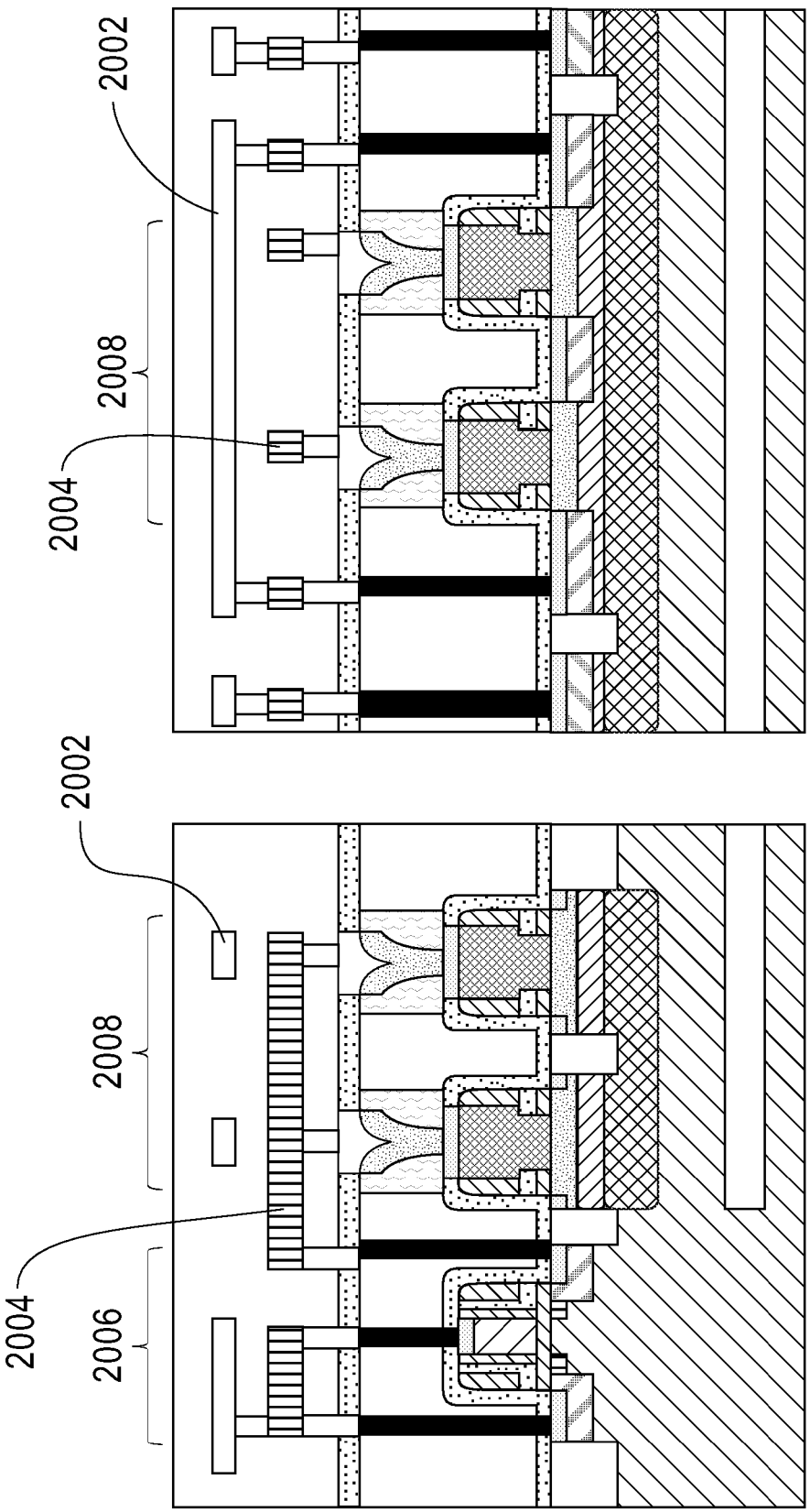

FIGS. 20A and 20B illustrate integration of memory cells 2008 and FET devices 2006, and metallization. The bit-line 2004 and word-line 2002 are formed in this process. For the memory cells 2008 and FET devices 2006, the bit-lines 2004 and the word-lines 2002 are formed from a conductive metal such as copper (Cu). As illustrated, the bit-lines 2004 in FIG. 17A and the word-lines 2002 in FIG. 17B are perpendicular to each other. Those skilled in the art will recognize the methods required for the bit-line 2004 and the word-line 2002 formation, integration, and metallization.

Additionally, as mentioned above the processes from FIGS. 16-20 are intended to only illustrate formation of one particular embodiment of the phase change element. In an alternate embodiment of the invention, the phase change layer is formed above the emitter contacts and the top electrode is formed above the phase change layer. Again, those skilled in the art will recognize the standard processes utilized for phase change layer formation (CVD, PVD), and electrode formation (metal sputter).

Having described preferred embodiments for a process for PCM integration with poly-emitter BJT access device fabrication (which are intended to be illustrative and not limiting), it is noted that modifications and variations can be made by persons skilled in the art in light of the above teachings. It is therefore to be understood that changes may be made in the particular embodiments disclosed which are within the scope and spirit of the invention as outlined by the appended claims. Having thus described aspects of the invention, with the details and particularity required by the patent laws, what is claimed and desired protected by Letters Patent is set forth in the appended claims.

What is claimed is:

1. A method for forming a memory cell, the method comprising:
   forming a buried doped region, shallow trench isolation regions, and a first insulating layer on a starting substrate such that the buried doped region is formed within a memory array region of the substrate, the shallow trench isolation regions are formed within the substrate and the top of the shallow trench isolation regions are continuous with the surface of the substrate, and the first insulating layer is disposed on the top surface of the substrate and top surfaces of the shallow trench isolation regions;
   forming a base region, a pedestal collector, and a sub-collector within the substrate below the first insulating layer in the memory array region such that the sub-collector is formed above the buried doped region, the pedestal collector is formed above the sub-collector, and the base region is formed above the pedestal collector;
   removing the first insulating layer;
   forming field effect transistor (FET) gate stacks and sacrificial memory cell gate stacks over the substrate, the sacrificial memory cell gate stacks and the FET gate stacks comprising a gate oxide layer and a semiconductor layer, the sacrificial memory cell gate stacks disposed above the base region and pedestal sub-collector in the memory array region of the substrate, and the FET gate stacks disposed above a FET region in the substrate, the FET region being separate from the memory array region;
   forming spacer layers around the FET gate stacks and around the sacrificial memory cell gate stacks, and above the substrate;
   forming doped regions for source-drain contacts in the FET region, in between the sacrificial memory cell gate stacks and the spacer layers surrounding the sacrificial memory cell gate stack, and for base and collector contacts in the memory array region;
   converting at least a portion of the doped regions into silicide regions such that source-drain contact silicide regions in the FET region are formed, FET gate stack silicide regions are formed, and base and collector contact silicide regions are formed;
   forming a passivation layer above the substrate, the FET gate stacks, the sacrificial memory cell gate stacks, and above and around the spacer layers;
   forming a surrounding insulating layer above the passivation layer;
   forming metal liner and plugs within trenches, the trenches formed through the surface of the surrounding insulating layer to the source-drain contact silicide regions in the FET region, and to the base and collector contact silicide regions;
   removing the sacrificial memory cell gate stacks such that the spacer layers formed around the sacrificial memory cell gate stacks are still intact;
   forming bipolar junction transistor (BJT) cell stacks in the space between the spacer layers where the sacrificial cell gate stacks were formed and removed, the BJT cell stacks including an emitter layer;
   converting at least a portion of the emitter layer into a silicide compound such that emitter layer contact silicide regions are formed;
   forming a phase change layer above the emitter contacts; and
   forming an electrode above the phase change layer.

2. The method of claim 1, wherein forming the FET gate stacks and the sacrificial memory cell gate stacks include:
   forming a gate oxide layer on the surface of the substrate;
   forming a semiconductor layer;
   forming a second insulating layer;
   etching, using standard photolithography techniques, into the substrate such that the gate oxide layer, the semiconductor layer, and the second insulating layer are substantially pillar-like structures above the substrate, the pillar like structures located in the memory array region of the substrate and the FET region of the substrate; and
   removing the second insulating layer.

3. The method of claim 2, wherein the semiconductor layer is polycrystalline silicon.

4. The method of claim 2, wherein the second insulating layer is tetraethyl orthosilicate (TEOS).

5. The method of claim 1, wherein forming the spacer layers include:
   forming a first oxide layer above the substrate, and above and along the sidewalls of the FET gate stacks and the sacrificial memory cell gate stacks;
   forming a nitride layer above and along the sidewalls of the first oxide layer;
   forming a second oxide layer above and along the sidewalls of the nitride layer; and
   etching the first oxide layer, the nitride layer, and the second oxide layer such that only the sidewalls of the first oxide layer, the sidewalls of the nitride layer, and the sidewalls of the second oxide layer are retained.

6. The method of claim 5, further comprising forming halo implants under the first oxide layer in the FET region in the substrate.

7. The method of claim 1, wherein converting at least a portion of the doped regions into silicide compounds includes reacting the doped regions with a metal such that a silicide compound is formed.

8. The method of claim 1, further comprising activating the dopants in the doped regions with a rapid thermal anneal (RTA).

9. The method of claim 1, wherein forming the metal liner and plugs to the source-drain contact silicide regions in the FET region, to the FET gate stack silicide regions, and to the base and collector contact silicide regions comprises:
   forming the trenches in the surrounding insulating layer and the passivation layer with standard photolithography techniques such that the bottom of the trenches are the top surfaces of the source-drain contact silicide regions in the FET region, the top surfaces of the FET gate stack silicide regions, and the top surfaces of the base and collector contact silicide regions; and
   forming the metal liner and plugs in the FET region in the trenches.

10. The method of claim 1, wherein the metal liner and plugs are respectively comprised of titanium nitride (TiN) and tungsten (W).

11. The method of claim 1, wherein the surrounding insulating layer is low temperature oxide.

12. The method of claim 1, wherein the passivation layer is passivating silicon nitride.

13. The method of claim 1, wherein removing the sacrificial memory cell gate stacks comprises:
    forming a top nitride layer above the liner and plugs in the FET region, and above the surrounding insulating layer;
    forming a sacrificial emitter layer above the top nitride layer;
    etching the sacrificial memory cell gate stacks, the etch including standard photolithography techniques; and
    forming BJT cell vias by etching the sacrificial memory cell gate stacks such that the bottom of the BJT cell vias are the top surface of the gate oxide layer.

14. The method of claim 13, further comprising:
    forming sacrificial sidewall emitter layers in the BJT cell vias such that the sidewalls of the BJT cell vias are completely lined with the sacrificial sidewall emitter layers; and
    etching the gate oxide layer at the bottom of the BJT cell vias.

15. The method of claim 1, wherein the emitter layer is comprised of polycrystalline silicon.

16. The method of claim 1, wherein converting at least a portion of the emitter layer into silicide regions includes reacting the emitter layer with a metal such that a silicide compound is formed.

* * * * *